United States Patent
Yang (10) Patent No.: US 8,689,434 B2
(45) Date of Patent: Apr. 8, 2014

(54) INTEGRATED CIRCUIT MANUFACTURING SYSTEM

(75) Inventor: Hui-Chen Yang, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 1211 days.

(21) Appl. No.: 12/579,303

(22) Filed: Oct. 14, 2009

(65) Prior Publication Data
US 2011/0087359 A1    Apr. 14, 2011

(51) Int. Cl.
*B23P 19/00* (2006.01)
(52) U.S. Cl.
USPC ............ 29/739; 29/709; 29/832; 700/121; 700/215
(58) Field of Classification Search
USPC ......... 29/709, 739, 740, 832, 833; 340/572.1; 700/116, 117, 121, 215
See application file for complete search history.

(56) References Cited

U.S. PATENT DOCUMENTS

| | | | |
|---|---|---|---|
| 5,822,210 A | 10/1998 | Kobayashi et al. | |
| 5,856,923 A * | 1/1999 | Jones et al. | 700/121 |
| 6,036,101 A | 3/2000 | Hass et al. | |
| 6,362,877 B1 | 3/2002 | Kobayashi et al. | |
| 6,607,130 B2 | 8/2003 | Gyllenskog | |
| 7,431,213 B2 | 10/2008 | Garapati et al. | |
| 2002/0018513 A1 | 2/2002 | Curry et al. | |
| 2003/0052171 A1 | 3/2003 | Gyllenskog | |
| 2004/0257230 A1 * | 12/2004 | Groeninger | 340/572.1 |
| 2007/0108277 A1 | 5/2007 | Garapati et al. | |
| 2008/0266357 A1 | 10/2008 | Silverbrook et al. | |

* cited by examiner

*Primary Examiner* — Donghai D Nguyen (57) ABSTRACT

An ICs modeling manufacturing procedure is disclosed. A first pattern is printed on a first surface of a printed circuit board (PCB). The first pattern includes a first barcode and a plurality of production codes. A plurality of elements are disposed on the first surface of the PCB. The PCB is heated to fix the elements on the first surface and secure the first pattern on the first surface of the PCB. When the first pattern is read, a first production information is obtained.

11 Claims, 9 Drawing Sheets

INTEGRATED CIRCUIT MANUFACTURING SYSTEM

BACKGROUND OF THE INVENTION

1. Field of the Invention

This invention relates to an integrated circuits (ICs) modeling manufacturing procedure, and more particularly to an ICs modeling manufacturing procedure providing traceable information.

2. Description of the Related Art

With technological development, more and more electronic products are utilizing integrated circuits (ICs), so that size thereof may be reduced. An IC is formed on a chip. The chip is formed on a wafer. Thus, the wafer comprises a plurality of chips. The chips are packaged and tested to produce ICs During producing ICs, a completely monitor and a traceable mechanism are established. Thus, a wrong process is fined out quickly when one process of the manufacturing procedure of the ICs is wrong. However, a completely monitor does not be established during modeling the ICs. Thus, the wrong process can not be traced when one process of the modeling procedure is wrong.

BRIEF SUMMARY OF THE INVENTION

An ICs modeling manufacturing procedure is provided. An exemplary embodiment of an ICs modeling manufacturing procedure is described in the following. A first pattern is printed on a first surface of a printed circuit board (PCB). The first pattern comprises a first barcode and a plurality of production codes. A plurality of elements are disposed on the first surface of the PCB. The PCB is heated to fix the elements on the first surface and secure the first pattern on the first surface of the PCB. When the first pattern is read, a first production information is obtained.

ICs modeling manufacturing systems are also provided. An exemplary embodiment of an ICs modeling manufacturing system comprises a PCB and a surface-mount technology (SMT) device. The PCB comprises a first surface and a second surface opposite to the first surface. The SMT device prints a first pattern on the first surface of the PCB, disposes a plurality of elements on the first surface of the PCB, and heats the PCB to fix the elements on the first surface and secures the first pattern on the first surface of the PCB. The first pattern comprises a first barcode and a plurality of production codes. When the first pattern is read, a first production information is obtained.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
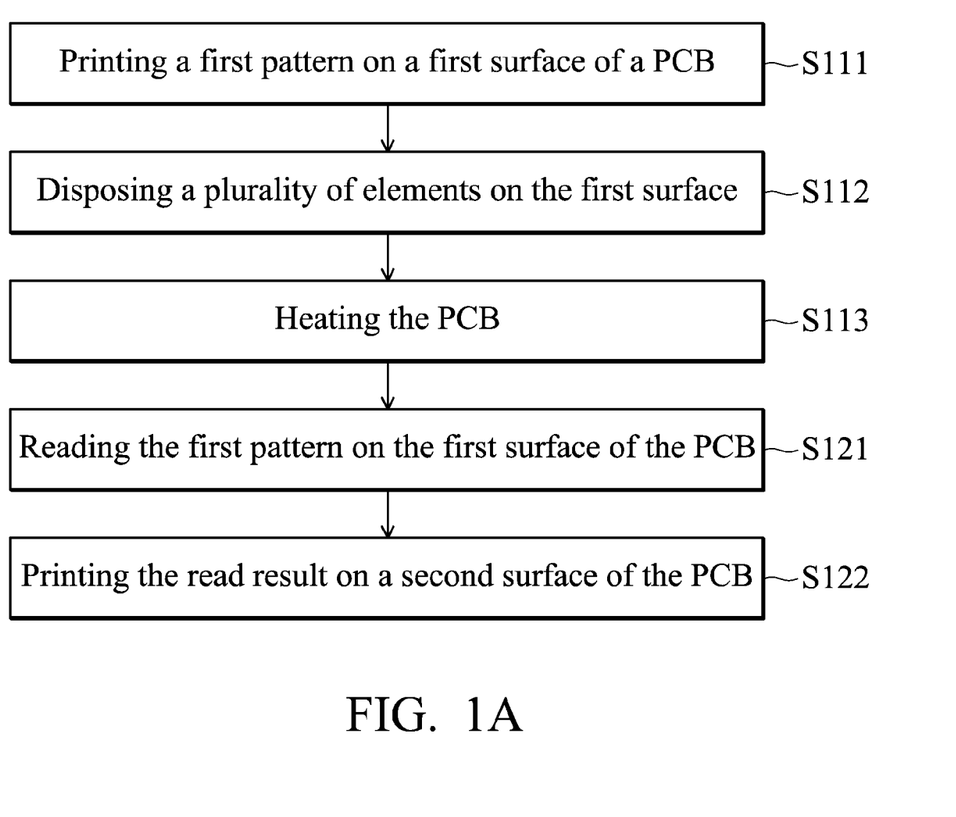
FIG. 1A is a schematic diagram of an exemplary embodiment of an ICs modeling manufacturing procedure of the invention.

FIG. 1A is a schematic diagram of an exemplary embodiment of an ICs modeling manufacturing procedure of the invention. First, a first pattern is printed on a first surface of a PCB (step S111). In one embodiment, an ink-jet method is utilized to print the first pattern on the first surface of the PCB.

In this embodiment, the first pattern is printed on an edge of the first surface of the PCB, but the disclosure is not limited thereto. Furthermore, before printing the first pattern, a white background is printed on the first surface of the PCB. Then, the first pattern is printed on the white background. In this embodiment, an ink-jet method is utilized to print the white background.

Figure 1B:
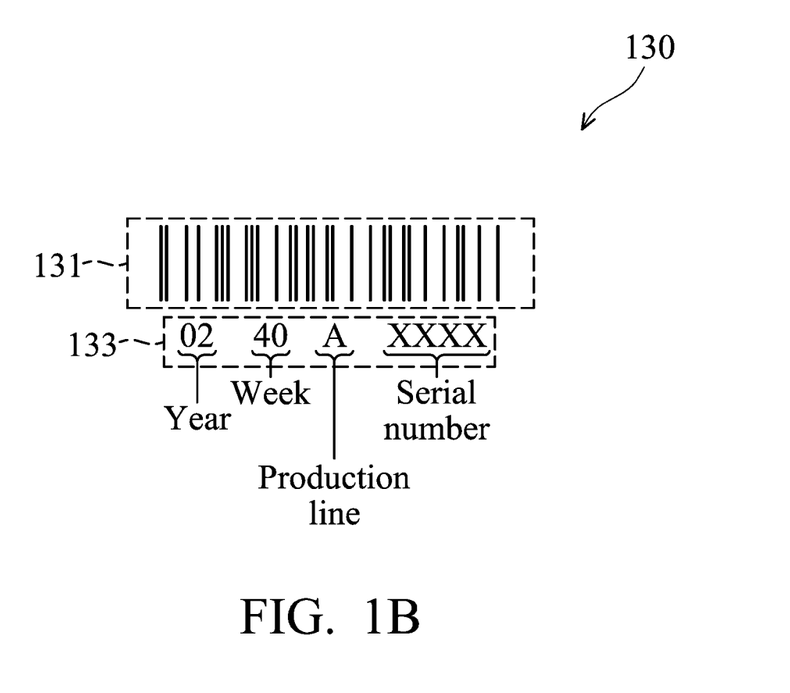
FIG. 1B is a schematic diagram of an exemplary embodiment of the first pattern of the invention.

In this embodiment, the first pattern comprises a first barcode and a plurality of production codes. FIG. 1B is a schematic diagram of an exemplary embodiment of the first pattern of the invention. The first pattern 130 comprises a first barcode 131 and production codes 133. The first to the fourth production code "0240" of the production codes 133 represent the time of the manufacturing procedure. The first and the second production codes "02" of the production codes 133 represent the year 2002. The third and the fourth production codes "40" of the production codes 133 represent the $40^{th}$ week.

The fifth production code "A" of the production codes 133 represents the production line that is processing the PCB. The sixth to the ninth production codes "XXXX" of the production codes 133 represent a serial number of the PCB. The invention does not limit the amount of production codes and the noted information.

Figure 1C:
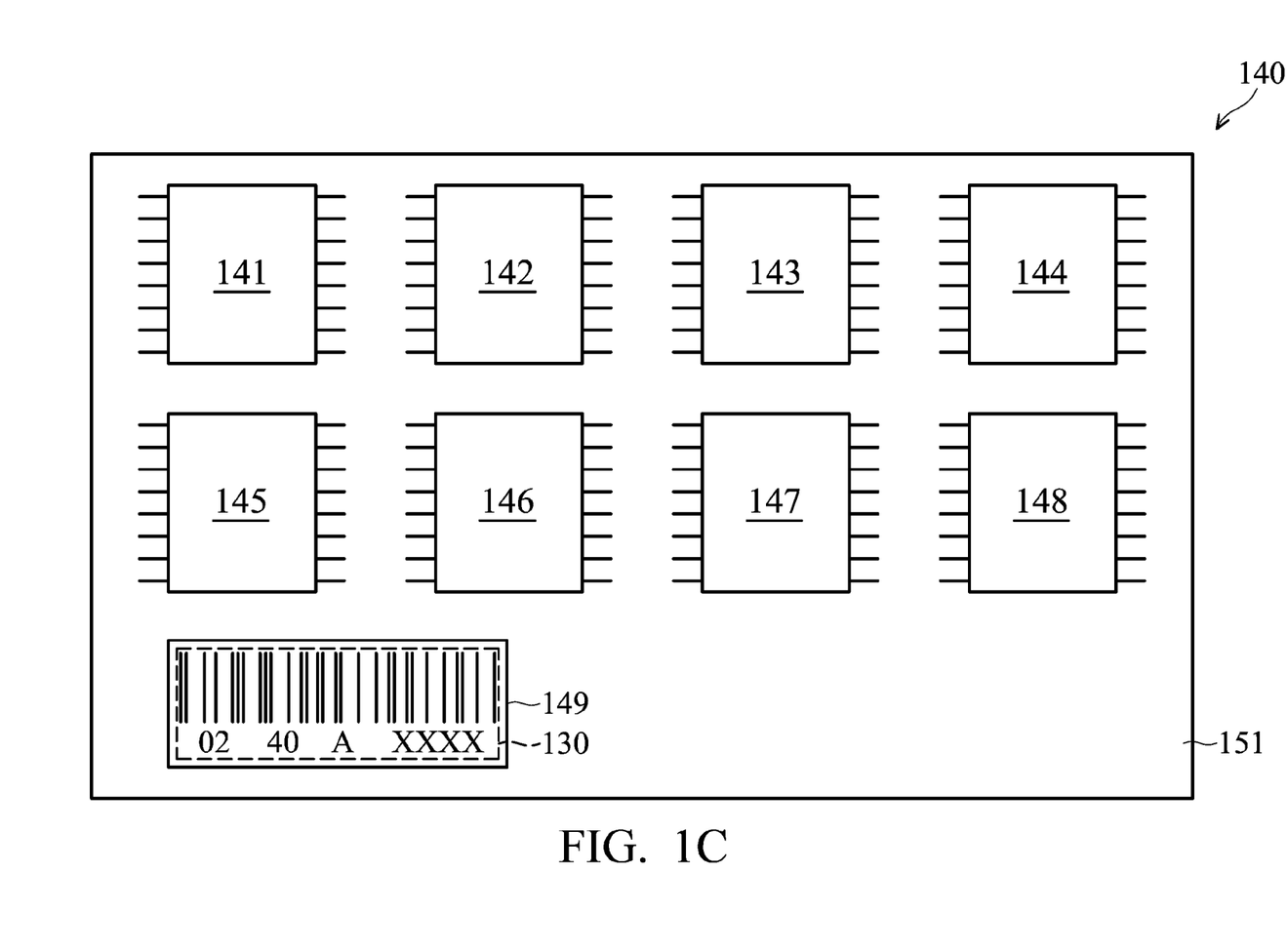
FIG. 1C is a schematic diagram of an exemplary embodiment of a PCB of the invention.

FIG. 1C is a schematic diagram of an exemplary embodiment of the PCB of the invention. The first pattern 130 is printed on an edge of the first surface 151 of the PCB 140. Further, the first pattern 130 is printed on the white background 149. In one embodiment, the white background 149 is printed on the first surface 151 of the PCB 140 by an ink-jet method.

A plurality of elements are disposed on the first surface of the PCB (step S112). Referring to FIG. 1C, the first surface 151 of the PCB 140 comprises the first pattern 130 and the elements 141~148. The invention does not limit the kind of elements 141~148. In one embodiment, one of the elements 141~148 is a volatile memory or a non-volatile memory.

The PCB is heated to fix the elements on the first surface 151 and secure the first pattern on first surface 151 of the PCB 140 (step S113). Referring to FIG. 1C, the PCB 140 comprises solder paste. When the elements 141~148 are disposed on the solder paste and the PCB 140 is heated, the elements 141~148 are fixed thereto.

Note that if the first pattern 130 is printed on the first surface 151 of the PCB 140 by an ink-jet method, the first pattern 130 may be easily removed. For example, before heating the PCB 140, the first pattern 130 may be removed by a solvent. After heating the PCB 140, the first pattern 130 is secure because the characteristic of the ink is changed. Thus, the first pattern 130 is secured on the first surface 151 of the PCB 140.

In this embodiment, a first production information is obtained after reading the first pattern 130. In one embodiment, the first production information is related to the elements and/or the PCB, but the disclosure is not limited thereto. In some embodiment, the manufacturing date of the elements 141~148, the time of disposing the elements 141~148 on the first surface 151, the production line disposing the elements 141~148 on the first surface 151, or the manufacturing date of the PCB 140 is obtained according to the first production information.

In other embodiments, the ICs modeling manufacturing procedure further comprises the steps S121 and S122. The first pattern on the first surface of the PCB is read (step S121). The read result is printed on a second surface of the PCB (step S122).

In this embodiment, the second surface is opposite to the first surface 151 of the PCB 140. For example, if the first surface 151 is the front surface of the PCB 140, the second surface is the back surface of the PCB 140.

Figure 2A:
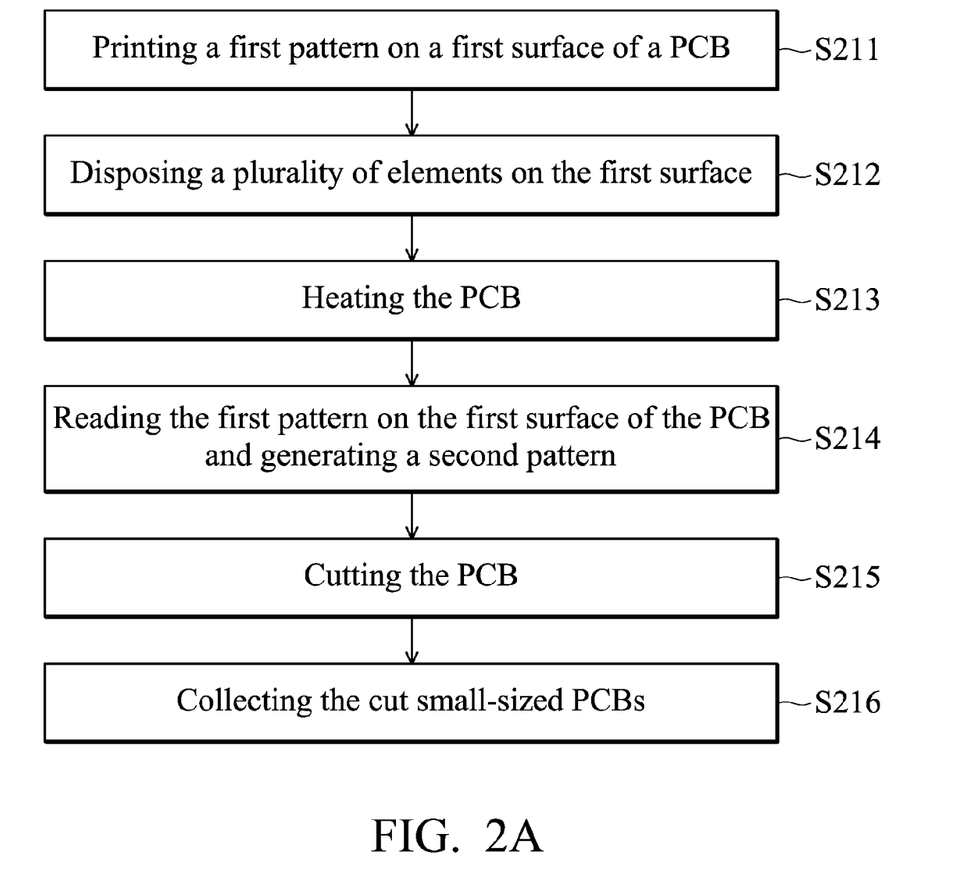
FIG. 2A is a schematic diagram of another exemplary embodiment of an ICs modeling manufacturing procedure of the invention.

FIG. 2A is a schematic diagram of another exemplary embodiment of an ICs modeling manufacturing procedure of the invention. FIG. 2A is similar to FIG. 1A except for the addition of steps S214~S216. Since the steps S211~S213 of FIG. 2A are the same as the steps S111~S113 of FIG. 1A, descriptions of the steps S211~S213 are omitted for brevity.

After heating the PCB (step S213), the first pattern is read to generate a second pattern (step S214). In this embodiment, the second pattern is printed on a second surface of the PCB 140. Next, a plurality of elements are disposed on the second surface of the PCB 140. In one embodiment, the PCB 140 may be a dual in-line memory module (DIMM). In one embodiment, the first pattern comprises a barcode and a plurality of production codes, the second pattern is printed on a label and the label can be pasted to one of the elements 141~148, one of the elements 141~148 is a volatile memory or a non-volatile memory.

Figure 2B:
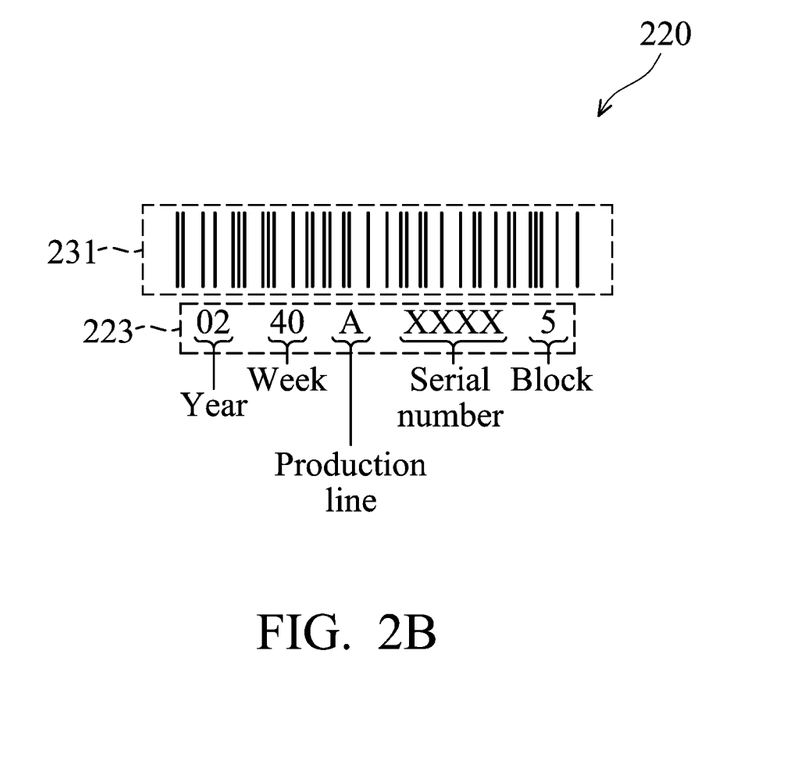
FIG. 2B is a schematic diagram of an exemplary embodiment of the second pattern of the invention.

FIG. 2B is a schematic diagram of an exemplary embodiment of the second pattern of the invention. As shown in FIG. 2B, the second pattern 220 comprises a second barcode 231 and a plurality of processing codes 223. In this embodiment, the second pattern 220 comprises ten processing codes. Furthermore, the first to the ninth processing codes of the processing codes 223 are the same as the first to the ninth production codes of the production codes 133 shown in FIG. 1B.

Figure 2C:
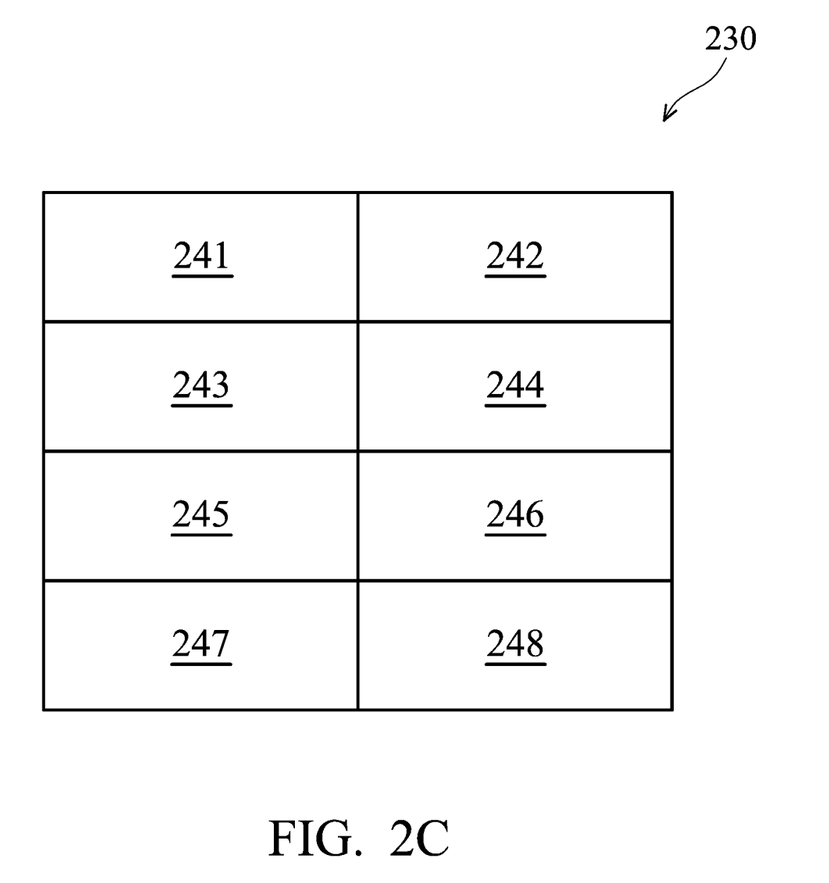
FIG. 2C is a schematic diagram of an exemplary embodiment of a PCB of the invention.

FIG. 2C is a schematic diagram of an exemplary embodiment of a PCB of the invention. The PCB 230 comprises PCB blocks 241~248. The PCB 140 is one of the PCB blocks 241~248. In other words, the PCB 230 can be cut into eight small-sized PCBs, as shown in FIG. 1C. The tenth processing code '5' of the processing code 223 represents that the PCB 140 is the block 245.

Next, the PCB (e.g. 230) is cut (step S215). Generally, a PCB comprises a plurality of blocks, wherein each block comprises the same tracks and the same elements. When the PCB (e.g. 230) is heated and cut, a plurality of small-sized PCBs (e.g. 140) can be obtained. The cut small-sized PCBs are collected (step S216). In one embodiment, the steps 211~213 are executed in one machine and the steps 214~216 are executed in another machine.

Figure 3A:
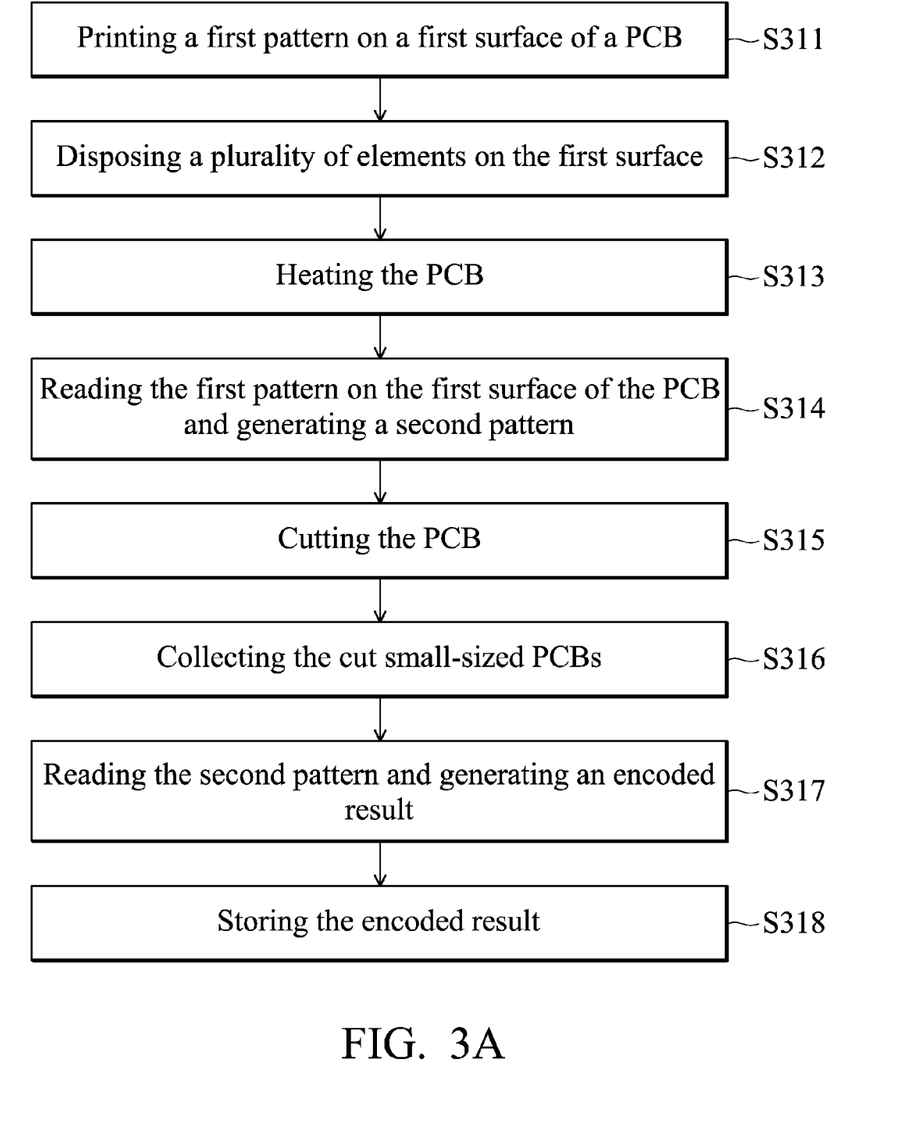
FIG. 3A is a schematic diagram of another exemplary embodiment of an ICs modeling manufacturing procedure of the invention.

FIG. 3A is a schematic diagram of another exemplary embodiment of an ICs modeling manufacturing procedure of the invention. FIG. 3A is similar to FIG. 2A except for the addition of steps S317~S318. Since the steps S311~S313 of FIG. 3A are the same as the steps S111~S113 of FIG. 1A and the steps S314~S316 of FIG. 3A are the same as the steps S214~S216 of FIG. 2A, descriptions of the steps S311~S316 are omitted for brevity.

Figure 3B:
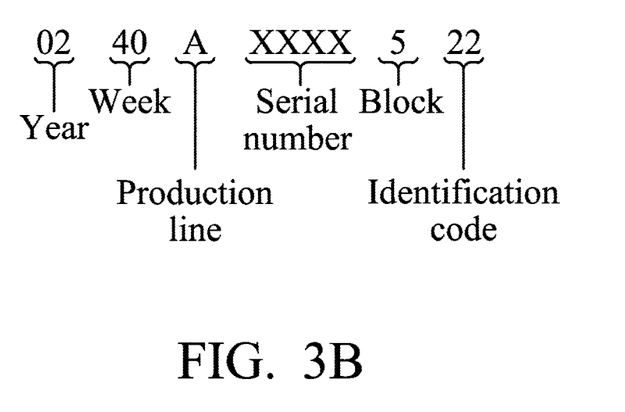
FIG. 3B is a schematic diagram of an exemplary embodiment of the encoded result of the invention.

In the step S317, the second pattern is read to generate an encoded result. In an exemplary embodiment, the second pattern comprises a barcode and a plurality of processing codes. FIG. 3B is a schematic diagram of an exemplary embodiment of the encoded result of the invention. As shown in FIG. 3B, the encoded result comprises a plurality of note codes. In this embodiment, the amount of note codes is twelve. The first and the tenth note codes of the note codes are the same as the first and the tenth processing codes of the processing codes 223.

The encoded result is stored (step S318). In one embodiment, the encoded result is stored in a storage unit, such as an EEPROM. In this embodiment, the eleventh and the tenth note codes of the note codes represent the identification code of the storage unit.

In addition, when the encoded result is read, a second production information is obtained. In this embodiment, the second production information is related to the manufacturing procedure. In one embodiment, the second production information relates to the elements 141~148, the PCB 140 or 230, or the storage unit.

For example, the manufacturing date of the elements 141~148, the time of disposing the elements 141~148 on the first surface 151, the production line disposing the elements 141~148 on the first surface 151, or the manufacturing date of the PCB 230 is obtained according to the second production information.

During each stage of the ICs modeling manufacturing procedure, corresponding codes are generated. Thus, the traceability of the ICs modeling manufacturing procedure is increased according to the corresponding codes. If one stage of the ICs modeling manufacturing procedure is wrong, the wrong stage can be fined quickly.

Figure 4:
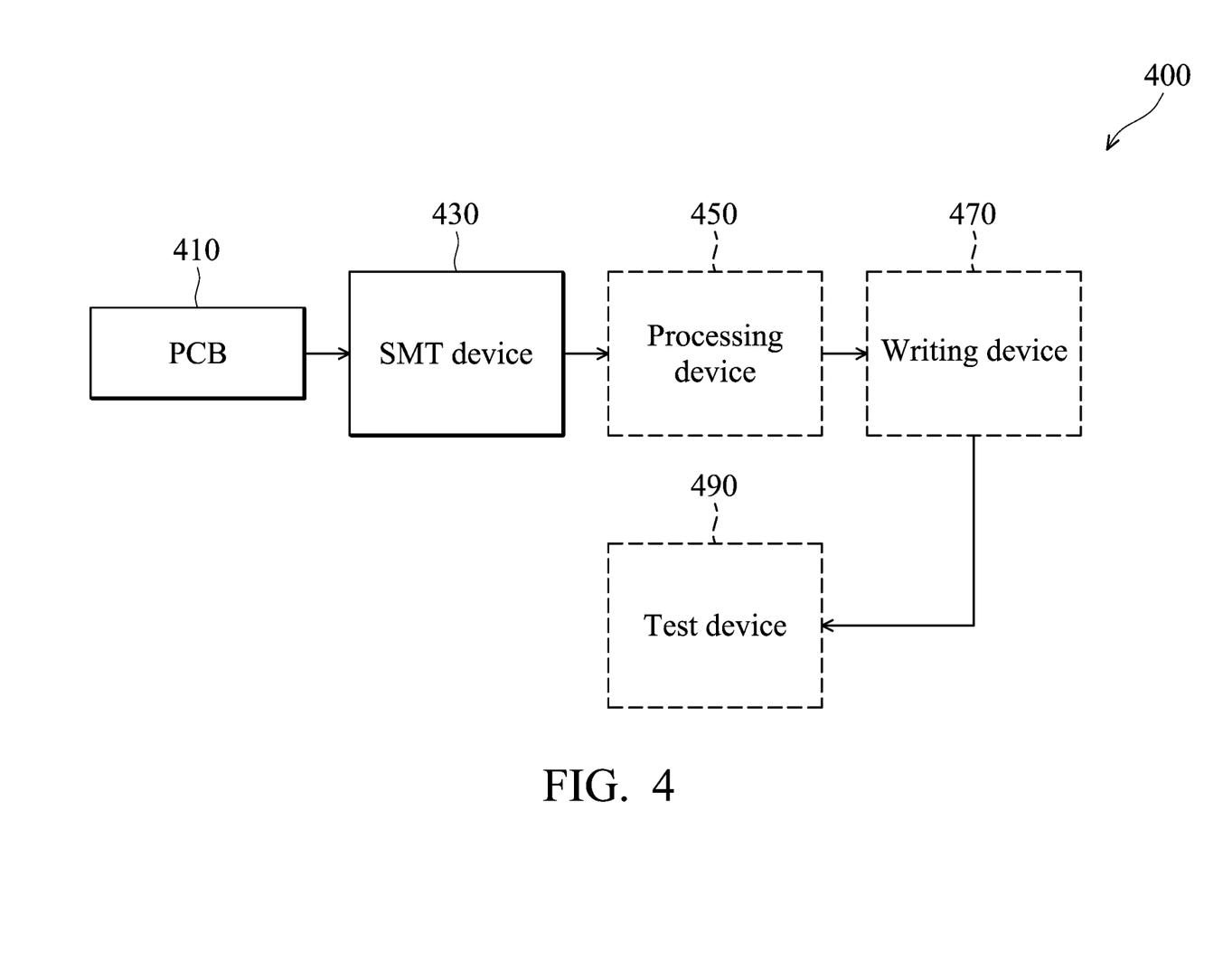
FIG. 4 is a schematic diagram of an exemplary embodiment of an ICs modeling manufacturing system of the invention.

FIG. 4 is a schematic diagram of an exemplary embodiment of a ICs modeling manufacturing system of the invention. The ICs modeling manufacturing system 400 comprises a PCB 410 and a surface-mount technology (SMT) device 430. The PCB 410 comprises a first surface and a second surface opposite to the first surface. For example, if the first surface is a front surface of the PCB 410, the second surface is a back surface of the PCB 410.

The SMT device 430 prints a first pattern on the first surface of the PCB 410. In this embodiment, the first pattern (e.g. the pattern 130 shown in FIG. 1B) comprises a barcode and a plurality of production codes. Further, when the PCB 410 enters the SMT device 430, the SMT device 430 heats the PCB 410. After heating the PCB 410, the elements on the PCB 410 are fixed and the first pattern is secured on the PCB 410. In this embodiment, when the first pattern is read, a first production information is obtained.

The first production information is related to the elements on the PCB 410 and/or the PCB 410. For example, production information may include the manufacturing date of the elements on the PCB 410, the time of disposing the elements on the PCB 410, or other information (such as the manufacturing date) relating to the PCB 410.

After heating the PCB 410, the PCB 410 enters the SMT device 430 again. The SMT device 430 reads the first pattern and prints the read result on the second surface. In one embodiment, the first pattern is printed on an edge of the first surface, but the disclosure is not limited thereto.

In this embodiment, an ink-jet method is utilized to print the first pattern on the first or the second surface. Additionally, a white background is printed on the first or the second surface before printing the first pattern. After printing the white background, the first pattern is printed on the white background. In this case, the white background is printed on the first or the second surface by the ink-jet method.

The ICs modeling manufacturing system 400 further comprises a processing device 450. The processing device 450 reads the first pattern of the PCB 410 and generates a second pattern according to the read result. In this embodiment, the second pattern (as shown in FIG. 2B) comprises a barcode and a plurality of processing codes. In other embodiments, the second pattern is printed on a label. The label can be pasted to the elements of the PCB 410.

In one embodiment, the barcode of the second pattern is similar to the barcode of the first pattern. Additionally, the amount of processing codes of the second pattern is greater than the amount of production codes of the first pattern.

The PCB 410 may comprise a plurality of small-sized PCBs. Each small-sized PCB comprises the same circuit. Thus, the processing device 450 is utilized to cut the PCB 410 and collect the cut small-sized PCBs.

The ICs modeling manufacturing system 400 further comprises a writing device 470. The writing device 470 reads the second pattern generated by the processing device 450 and generates an encoded result according to the read result. In other embodiments, the writing device 470 directly reads the first pattern printed on the PCB 410.

The writing device 470 stores the encoded result into a storage unit (such as an EEPROM). The encoded result may comprises a plurality of note codes as shown in FIG. 3B. In this embodiment, the amount of note codes is greater than the amount of processing codes generated by the processing device 450.

In this embodiment, a second production information is obtained according to the encoded result. The second production information is similar to the first production information. The second production information is related to the elements of the PCB 410 and/or the PCB 410. Further, the identification code of the storage unit is obtained according to the second production information.

Referring to FIG. 4, the ICs modeling manufacturing system 400 further comprises a test device 490. The test device 490 tests the PCB 410. In one embodiment, the test device 490 stores the tested result to the storage unit.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit (IC) modeling manufacturing system, comprising:
    a printed circuit board (PCB) comprising a first surface and a second surface opposite to the first surface;
    a surface-mount technology (SMT) device printing a first pattern on the first surface of the PCB, disposing a plurality of elements on the first surface, and heating the PCB to fix the elements on the first surface and secure the first pattern on the first surface of the PCB, wherein the first pattern comprises a first barcode and a plurality of production codes and when the first pattern is read, a first production information is obtained; and
    a processing device reading the first pattern to generate a second pattern, cutting the PCB into a plurality of small-sized PCBs, and collecting the cut small-sized PCBs.

2. The IC modeling manufacturing system as claimed in claim 1, wherein the second pattern comprises a second barcode and a plurality of processing codes, and the amount of production codes is less than the amount of processing codes.

3. The IC modeling manufacturing system as claimed in claim 2, further comprising:
    a writing device reading the second pattern to generate an encoded result and storing the encoded result into a storage unit, wherein a second production information is obtained according to the encoded result.

4. The IC modeling manufacturing system as claimed in claim 3, wherein the encoded result comprises a plurality of note codes, and the amount of processing codes is less than the note codes.

5. The IC modeling manufacturing system as claimed in claim 3, further comprising:
    a test device testing the PCB and the elements and storing the tested result to the storage unit.

6. The IC modeling manufacturing system as claimed in claim 1, wherein the first and the second production information is related to at least one of the elements and the PCB.

7. The IC modeling manufacturing system as claimed in claim 6, wherein the manufacturing date of the elements, the time of disposing the elements on the first surface or the manufacturing date of the PCB is obtained according to the first or the second production information.

8. The IC modeling manufacturing system as claimed in claim 1, wherein the SMT device reads the first pattern and prints the read result on the second surface of the PCB.

9. The IC modeling manufacturing system as claimed in claim 8, wherein the SMT device disposes a plurality of elements on the second surface of the PCB and the PCB is a dual in-line memory module (DIMM).

10. The IC modeling manufacturing system as claimed in claim 1, wherein the SMT device utilizes an ink-jet method to print the first pattern on the first surface of the PCB.

11. The IC modeling manufacturing system as claimed in claim 1, wherein the elements comprise volatile and non-volatile memories.

* * * * *